United States Patent [19]

Nakano et al.

[11] Patent Number: 5,893,982
[45] Date of Patent: Apr. 13, 1999

[54] PREVENTION OF EDGE STAIN IN SILICON WAFERS BY OXYGEN ANNEALING

[75] Inventors: Masami Nakano; Jim Woodling, both of Vancouver, Wash.

[73] Assignee: Seh America, Inc., Vancouver, Wash.

[21] Appl. No.: 08/780,349

[22] Filed: Jan. 8, 1997

[51] Int. Cl.$^6$ .................................................. H01L 21/322
[52] U.S. Cl. ........................... 216/89; 216/55; 216/99
[58] Field of Search ................................ 216/89, 99, 55

[56] References Cited

U.S. PATENT DOCUMENTS 5,437,761  8/1995  Koide .

FOREIGN PATENT DOCUMENTS 5144827  6/1993  Japan .

*Primary Examiner*—R. Bruce Breneman
*Assistant Examiner*—George Goudreau
*Attorney, Agent, or Firm*—Bell Seltzer Intellectual Property Group of Alston & Bird LLP

[57] ABSTRACT

A method of preventing edge stain in silicon wafers from the edge polishing step with an alkaline slurry, the method consisting of formation of an oxide layer by an annealing step in the presence of oxygen prior to edge polishing.

10 Claims, No Drawings

PREVENTION OF EDGE STAIN IN SILICON WAFERS BY OXYGEN ANNEALING

BACKGROUND OF THE INVENTION

Production of silicon wafers for the manufacture of semiconductor chips requires that the wafer be ground to an exact diameter and that the periphery or outer edge of the wafer be defect-free down to a microscopic level. As part of the production process, a wafer is typically provided with a chamfer on its outer edge to reduce stress on the edge, which in turn helps prevent chipping and cracking of the wafer. The wafer also typically receives a chemical etch, followed by high temperature annealing in an inert gas atmosphere, such as nitrogen. However, the chemical etch step typically leaves a somewhat roughened surface on the chamfered edge of the wafer. Recently, particularly in the production of large diameter wafers, the wafers have been edge polished with standard polishing slurry solutions to smooth out the roughened chamfered edge resulting from the etching, and further to reduce stress caused by edge grinding to the precise diameters required. Edge polishing results in a mirror-like surface that resists adhesion of contaminating particulates.

However, such edge polishing is by means of an aqueous alkaline colloidal silica-containing slurry which provides the abrasive for the polishing process. This alkaline slurry occasionally splashes on to the surface of the wafer, causing a modest degree of unwanted etching both on the wafer surface and on the edge of the wafer, and becomes especially noticeable over time as evaporation of water in the slurry increases the concentration of caustic in the slurry. When the resulting unwanted etching is visible by halogen light inspection, the wafer is rejected as unacceptable product for so-called "edge stain," a micro-defect on the surface of the wafer that appears as microscopic pitting.

Although it is well known that a silicon oxide layer may be formed on wafers by exposing them to oxygen at elevated temperatures (McGuire, *Semiconductor Materials and Process Technology Handbook*, pp. 46–77 (1988)), it is also reported that alkaline impurities such as sodium and potassium salts can diffuse rapidly through the oxide layers so formed, even at low temperature, and accordingly it is recommended that more dense dielectric films such as silicon nitride be used in combination with the oxide to passivate the wafers against such impurities. Ibid., p. 55. Since an edge polishing slurry is alkaline, containing sodium and/or potassium salts, the prior art clearly suggests that formation of a silicon oxide layer on a wafer would be of no value in preventing edge stain.

The present invention eliminates the need for a separate high temperature annealing step and provides a simple and efficient method of preventing edge stain.

BRIEF SUMMARY OF THE INVENTION

The essence of the present invention calls for the provision of a protective oxide layer just prior to edge polishing by substituting substantially pure oxygen for the nitrogen that is typically used in the high temperature annealing step in the production of high grade silicon wafers.

DETAILED DESCRIPTION OF PREFERRED EMBODIMENTS

According to the present invention, and in surprising contrast with prior art teachings to the effect that alkaline impurities such as potassium or sodium salts can penetrate silicon oxide layers, it has been found that unwanted etching from the alkaline slurries used in edge polishing may be prevented by the formation of an oxide layer produced by high temperature annealing of the wafer in the presence of substantially pure (typically "silicon grades" or at least 99.999% pure) oxygen. In the process of the present invention, such an oxygen annealing step also serves a secondary beneficial purpose of eliminating the need for a separate annealing step by simply replacing nitrogen with oxygen inasmuch as the annealing for both takes place in the same general temperature range.

Preferred conditions for the oxygen annealing step are from about 600° C. to about 1000° C. at atmospheric pressure for a period of from about 5 to about 120 minutes and with an oxygen volumetric flow of from about 0.5 to about 15, preferably about 2 to 4 liters per minute. Most preferred annealing conditions are about 700° C. for 30 minutes with a volumetric oxygen flow of 3 l/min. Even though the entire wafer receives a slight oxide coating, there is no need to remove the same.

EXAMPLE

Ten CZ-type Boron-doped and etched silicon wafers were divided into 2 batches of 5 wafers each. One batch was subjected to cleaning by hydrofluoric acid (HF); the second batch was treated by the oxygen annealing of the present invention. Both batches were then edge polished and inspected for edge stain.

Specifically, the HF cleaning comprised dipping the batch of 5 wafers in a 5 wt % solution of HF at 25° C. for 3 minutes, then rinsing in deionized water, followed by a spin dry. The oxygen annealing took place at 700° C. in a quartz annealing reactor of the same type used for the typical nitrogen annealing step in silicon wafer production, for 30 minutes, with an oxygen volumetric flow of 3 l/min.

Following the above treatment steps, both batches were edge polished with a standard polishing slurry comprising an aqueous 1 wt % NaOH solution containing colloidal silica (pH 11), then cleaned in the conventional fashion and visually inspected under halogen light for edge stain. The HF pre-cleaned wafers all showed significant edge stain after edge polishing, while the batch of oxygen annealed wafers all displayed no edge staining whatsoever, thereby demonstrating that the oxygen annealing of the present invention was extremely effective in preventing edge stain.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only-by the claims which follow.

We claim:

1. A process for edge polishing a silicon wafer comprising the following steps:

exposing the wafer to oxygen that is at least 99.999% pure;

annealing said wafer at a high temperature in the presence of oxygen that is at least 99.999% pure; and polishing the peripheral edge of said wafer with an aqueous alkaline slurry.

2. The process of claim 1 wherein said annealing step is performed at a temperature from 600 degrees C. to 1000 degrees C.

3. The process of claim 1 wherein said annealing step is conducted for a period of time from 5 minutes to 120 minutes.

4. The process of claim 3 wherein said exposing step is conducted for 30 minutes.

5. The process of claim 1 wherein said exposing step is conducted with an oxygen volumetric flow of from 0.5 to 15 liters per minute.

6. The process of claim 5 wherein said exposing step is conducted with an oxygen volumetric flow of 2 to 4 liters per minute.

7. A process for edge polishing a silicon wafer comprising the steps of:

exposing the wafer to oxygen that is at least 99.999% pure;

annealing said wafer in the presence of oxygen that is at least 99.999% pure to thereby form a protective oxide layer covering the wafer; and polishing the edge of the wafer while preventing edge stain as a result of having the protective oxide layer.

8. The process of claim 7 wherein said annealing step is performed at a temperature from 600 degrees C. to 1000 degrees C.

9. The process of claim 7 wherein the said annealing step is conducted for a period of time from 5 minutes to 120 minutes.

10. The process of claim 7 wherein said exposing step is conducted with an oxygen volumetric flow of 0.5 to 15 liters per minute.

* * * * *